(12) United States Patent
Jacquet et al.

(10) Patent No.: US 7,623,400 B2
(45) Date of Patent: Nov. 24, 2009

(54) MEMORY DEVICE WITH PROGRAMMABLE CONTROL FOR ACTIVATION OF READ AMPLIFIERS

(75) Inventors: Francois Jacquet, Froges (FR); Franck Genevaux, Revel (FR)

(73) Assignee: STMicroelectronics, SA, Montrouge (FR)

( * ) Notice: Subject to any disclaimer, the term of this patent is extended or adjusted under 35 U.S.C. 154(b) by 20 days.

(21) Appl. No.: 11/824,948

(22) Filed: Jul. 3, 2007

(65) Prior Publication Data

US 2008/0008020 A1    Jan. 10, 2008

(30) Foreign Application Priority Data

Jul. 5, 2006    (FR) ................... 06 06122

(51) Int. Cl.
    *G11C 7/02* (2006.01)
(52) U.S. Cl. .............. 365/210.1; 365/210.14; 365/210.12; 365/210.15
(58) Field of Classification Search .......... 365/210.1, 365/210.14, 120.12, 120.15
    See application file for complete search history.

(56) References Cited

U.S. PATENT DOCUMENTS

| | | | | |
|---|---|---|---|---|
| 6,172,925 B1 * | 1/2001 | Bloker | .................. | 365/210.12 |
| 6,181,626 B1 * | 1/2001 | Brown | .................... | 365/210.1 |
| 6,285,604 B1 * | 9/2001 | Chang | ....................... | 365/200 |
| 6,717,842 B2 * | 4/2004 | Watanabe et al. | ........... | 365/154 |
| 6,804,153 B2 * | 10/2004 | Yoshizawa et al. | ..... | 365/189.15 |
| 6,831,853 B2 * | 12/2004 | Lin et al. | .................... | 365/154 |
| 6,870,777 B2 * | 3/2005 | Maki | ..................... | 365/189.07 |
| 6,996,020 B2 * | 2/2006 | Yoshida | .................. | 365/210.1 |
| 6,999,367 B2 * | 2/2006 | Yamagami | ............... | 365/210.1 |
| 2002/0186579 A1 | 12/2002 | Yokozeki | | |
| 2003/0202412 A1 | 10/2003 | Nii et al. | | |
| 2004/0202035 A1 | 10/2004 | Tsujimura et al. | | |
| 2005/0286323 A1 | 12/2005 | Ohtsuki et al. | | |

FOREIGN PATENT DOCUMENTS

EP    000422939 A2 *    4/1991
JP    02002260386 A *    9/2002

OTHER PUBLICATIONS

French Search Report, FR 0606122 Dec. 21, 2006.

* cited by examiner

*Primary Examiner*—Viet Q Nguyen
(74) *Attorney, Agent, or Firm*—Kevin D. Jablonski; Graybeal Jackson LLP

(57) ABSTRACT

An embodiment of the invention relate to a memory device including a memory plane composed of memory cells located at the intersection of lines and columns, and a dummy path designed to output a signal to activate read amplifiers arranged at the bottom of the columns in the memory plane, said dummy path including dummy memory cells connected between two dummy bit lines means of selecting at least one dummy cell designed to discharge at least one of the dummy bit lines, and control means connected to the two dummy bit lines to generate said activation signal, characterized in that said device includes means of programming the number of selected cells to discharge at least said dummy bit line, to adjust the time at which said activation signal is output.

15 Claims, 4 Drawing Sheets

MEMORY DEVICE WITH PROGRAMMABLE CONTROL FOR ACTIVATION OF READ AMPLIFIERS

PRIORITY CLAIM

This application claims priority from French patent application No. 06/06122, filed on Jul. 5, 2006, which is incorporated herein by reference.

TECHNICAL FIELD

An embodiment of the invention relate to the field of memories in integrated circuits and more particularly control over outputting a signal to activate read amplifiers arranged at the bottom of memory columns.

An embodiment of the invention is particularly, but not exclusively, applicable to SRAM (Static Random Access Memory), namely static RAM.

BACKGROUND

FIG. 1 diagrammatically shows a memory plane MEM of the above-mentioned type that conventionally includes word lines WLi and columns COLj, each including two bit lines BL0 and BL1.

The memory cells in such a memory plane, not shown in FIG. 1 for simplification reasons, are differentially connected between two bit lines BL0 and BL1 in each column in the memory plane and may be activated by a word line WLi.

Moreover, read amplifiers SA are arranged at the bottom of columns in the memory plane and are conventionally activated by an activation signal output by control means MC.

A memory cell in the memory plane is shown in FIG. 2. This cell includes a first inverter InvA and a second inverter InvB connected back to front between a first node A and a second node B. Each inverter InvA and InvB is composed of an nMos transistor, N0 and N1 respectively, and a pMos transistor, P0 and P1 respectively. A first access transistor TA is provided, of which a drain is connected to node A, a gate is connected to a word line WL in the memory plane, and a source is connected to a first bit line BL0. A second access transistor TB is also provided, of which a drain is connected to node B, a gate is connected to the word line WL and a source is connected to the second bit line BL1 of the memory cell column.

A memory cell in a column of memory cells in the memory is programmed by applying a potential Vdd onto the word line WL associated with the cell to be programmed, and depending on the data 0 or 1 to be programmed in the selected cell, a zero potential (connection to the ground) or the potential Vdd is applied onto the first bit line BL0, and a potential inverse to the potential applied to the line BL0 is applied to the second bit line BL1. For example, to program a logical 0 in the memory cell in FIG. 2, VDD is applied on line WL and on line BL1, and line BL0 is connected to the ground.

During a read operation of this memory cell, the two lines BL0 and BL1 are precharged to a power supply potential Vdd, and the corresponding word line WL is set to potential Vdd to select the memory cell in read (the other word lines being connected to the ground). The word line WL is at the high potential, therefore the access transistors TA and TB of the cell are conducting. According to the example, since node A is equal to 0 and line BL0 is precharged at Vdd, a current circulates through the channel of the access transistor TA which will discharge the line BL0 and progressively sets its potential to 0. On the other hand, node B in the memory cell and the bit line BL1 are at the same potential, the line BL1 is assumed to remain in its high precharge state, namely at the potential Vdd (in fact this other bit line may nevertheless be set to ground due to parasite leakage currents from other memory cells connected to this other bit line, but processing of this parasite behavior is not the subject of the present application).

The amplifier SA arranged at the bottom of the memory column with its two differential inputs connected to the first bit line BL0 and to the second bit line BL1 respectively, will then detect a potential difference between lines BL0 and BL1 after a certain time due to the progressive discharge of line BL0, and consequently will produce data corresponding to the data memorised in the memory cell, namely a logical 0 according to the example.

Due to the intrinsic characteristics of the transistors forming a read amplifier SA, it is essential that the read amplifier SA in the memory should be activated at a specific time of the read operation so that signals applied to the inputs enable the amplifier to correctly detect the potential difference expected between the two bit lines BL0 and BL1 and thus obtain the good read value. More precisely, the differential amplifier SA located at the bottom of the column needs to be activated when the potential of the bit line discharging during reading is low enough so that the potential difference between the two bit lines is greater than the input offset voltage of the amplifier (this offset voltage corresponding to the threshold starting from which the read amplifier is capable of amplifying the data from the memory point read without error, is due to variation of production parameters).

Consequently, the memory is normally equipped with a dummy path referenced CHdum in FIG. 1, designed to self adjust the time at which the control means MC output the signal to activate the read amplifiers arranged at the bottom of the memory plane columns.

This dummy path includes a dummy column formed from two dummy bit lines DBL0 and DBL1. Dummy memory cells CELDi are connected to this dummy column, of which at least one of them referenced CLD1 is activated by a dummy word line DWL.

The dummy memory cell CELD1 activated by the dummy word line DWL is programmed so as to discharge (set to the ground) at least one of the dummy bit lines DBL0 and DBL1. The dummy bit line that will be discharged when the dummy cell CELD1 is activated, is then used in a manner known per se, to generate the read amplifiers activation signal Act in the memory plane through the control means MC. As an example embodiment, the dummy bit line (or the two dummy bit lines connected together when the discharge of the two dummy bit lines is used to generate the activation signal) is connected to the input of an inverter (not shown) provided within the control means MC to output the activation signal Act.

In practice, several dummy memory cells CELD1 to CELDn can be activated by the word line DWL so as to produce a discharge of the dummy bit line(s) that takes place more quickly than the discharge from a standard bit line BLT of a column in the memory plane.

FIG. 3 shows an example of a dummy memory cell CELDn configured to discharge the two dummy bit lines DBL0 and DBL1 of the dummy path when it is activated by DWL for the purpose of generating the signal to activate memory plane read amplifiers. The dummy memory cell includes four memory transistors N4/P4 and N5/P5, each pair of transistors in series, N4/P4 and N5/P5 respectively, forming a first and a second inverter and two access transistors N2 and N3. The first access transistor N2 has its drain connected to the output from inverter N4/P4, its gate connected to the dummy word line DWL and its source connected to the dummy bit line DBL1. The second access transistor N3 has its drain connected to the output from the inverter N5/P5, its gate connected to the dummy word line DWL and its source connected to the dummy bit line DBL1.

According to the example in FIG. 3, each dummy memory cell activated by the dummy word line DWL is therefore configured so as to set the two dummy bit lines DBL0 and DBL1 towards the ground, in other words to discharge them, these two dummy bit lines then being connected together at the input to the inverter of the control means MC provided to generate the activation signal.

To achieve this, the corresponding inputs of each inverter N4/P4 and N5/P5 in the dummy memory cell are connected to Vdd (high logical levels). Thus, the two internal nodes in the cell formed by the corresponding outputs of each inverter, have their value hard coded. Since the gate of the access transistors N2 and N3 is connected to the dummy word line DWL, when this word line is activated, the dummy bit lines DBL0 and DBL1 discharge through the transistors N3 and N5 and N2 and N4 respectively, that are then conducting.

In one variant, it is possible to use only a single side of the dummy memory cell, so as to use the discharge from a single dummy bit line to generate the activation signal Act. FIG. 4 shows such a dummy memory cell, that when it is activated by the word line DWL, is configured so as to set the dummy bit line DBL1 to the ground. To achieve this, the two inverters N4/P4 and N5/P5 are connected back to front and the input of inverter N4/P4 is looped back to the output from inverter N5/P5 and connected to Vdd. The two internal nodes of the cell formed from the corresponding outputs from each inverter, then have their value hard coded. Since the gate of the access transistor N2 is connected to the dummy word line DWL when it is active, the dummy bit line DBL1 discharges through transistors N2 and N4, both being conducting in this case. The other side of the memory cell is not used, the gate of the access transistor N3 then being connected to the ground Gnd.

Furthermore, in prior art, a delay circuit is usually provided in the dummy path and more precisely is integrated in the control circuitry MC, so that the time at which the signal to activate read amplifiers SA in the memory plane is output can be adjusted, so that the memory can operate correctly in all situations. Typically, an RC circuit or a logical gate is used to manage the delay composed of a plurality of inverters in series in order to delay output of the activation signal.

However, such a control to activate amplifiers to read the memory limits the possibilities of the memory being integrated. Firstly as explained above, it imposes that the value of the internal nodes of dummy memory cells activated by the dummy word line is hard coded, which is restrictive in terms of design rules for manufacturing the memory, and secondly special circuitry has to be provided in the dummy path, in fact the delay circuit, to be able to adjust the memory plane read amplifiers to optimise output of the activation signal. Furthermore, the delay thus generated by the delay circuit is not related to the discharge time of the bit line, therefore it has the disadvantage that it does not vary in the same way as the discharge from the bit line when faced with variations in manufacturing processes.

Embodiments of the invention are intended to overcome at least some of the above-mentioned disadvantages.

SUMMARY

An embodiment of the invention is a memory device including a memory plane composed of memory cells located at the intersection of lines and columns in the memory plane, and a dummy path designed to output a signal to activate read amplifiers arranged at the bottom of the columns in the memory plane, said dummy path including dummy memory cells connected between two corresponding dummy bit lines, means of selecting at least one cell among said dummy memory cells, being designed to discharge at least one of the dummy bit lines and control means connected to the two dummy bit lines to generate said activation signal, characterised in that said device includes means of programming the number of dummy memory cells selected to discharge at least said dummy bit line, so as to adjust the time at which said activation signal is output.

Advantageously, according to one embodiment of the invention, the programming means include at least one binary signal that will be applied to the selected dummy memory cells, so as to activate at least one cell among said selected dummy memory cells.

Advantageously, according to one embodiment of the invention, the dummy memory cells that will discharge at least one of the dummy bit lines are connected in groups of a predetermined number of cells along the dummy path, the binary programming signals being associated with each group of corresponding cells, so that each can activate all cells in the corresponding group.

According to a first embodiment of the invention, a dummy memory cell programmed in selection can be used to discharge a single dummy bit line.

According to a second embodiment of the invention, a dummy memory cell programmed in selection can be used to discharge the two dummy bit lines simultaneously.

According to the second embodiment, a dummy memory cell programmed in selection includes a first inverter and a second inverter, a first access transistor of which a drain is connected at the output from the first inverter, a gate is connected to the programming means and a source is connected to one of the dummy bit lines, and a second access transistor of which a drain is connected to the output from the second inverter, a gate is connected to the programming means, and a source is connected to the other dummy bit lines, the input of each of the two memory cell inverters being connected to the selection means.

Each inverter may include an NMOS transistor and a PMOS transistor connected in series between a power supply potential and a ground potential, the two gates of each of said transistors receiving the input from the inverter.

According to one variant of the second embodiment, a dummy memory cell programmed in selection includes a first memory transistor, of which a source is connected to a ground potential, a gate is connected to the selection means and a drain is connected to a drain of a first access transistor, of which a gate is connected to the programming means and a source is connected to one of the dummy bit lines, and a second memory transistor of which a source is connected to a ground potential, a gate is connected to the selection means and a drain is connected to a drain of a second access transistor, of which a gate is connected to the programming means and a source is connected to the other of the dummy bit lines.

The selection means may include a dummy word line of the dummy path.

According to one embodiment, the control means to output the signal to activate read amplifiers in the memory plane include an inverter for which the input is controlled by the discharge current of the dummy bit line(s) connected together that will be discharged.

Another embodiment of the invention is a method of controlling the output of a signal to activate read amplifiers arranged at the bottom of columns in a memory plane of a memory, this memory including a dummy path including dummy memory cells connected between two dummy bit lines respectively, said method comprising a step of selecting at least one dummy cell among said dummy memory cells, designed to discharge at least one of the two dummy bit lines used to generate said activation signal, and a step consisting of programming activation of a given number of cells among said at least one selected dummy memory cell that will discharge at least said dummy bit line, said programmed number being used to adjust the time at which said activation signal is output.

BRIEF DESCRIPTION OF THE DRAWINGS

Characteristics and advantages of various embodiments of the invention will become clearer after reading the following description given as an illustrative and non-limitative example, with reference to the appended FIGS. 1-7 in which.

DETAILED DESCRIPTION

Generation of the signal to activate read amplifiers arranged at the bottom of columns in the memory plane is based on the discharge current from the dummy bit lines (or from a single dummy bit line in one variant), that controls changeover of the inverter of the control means provided to output the activation signal.

Thus, depending on the time necessary for the inverter to reach the changeover threshold, the signal to activate the read amplifiers will be output more or less quickly at the output from the inverter. But the discharge time of the dummy bit lines used to control changeover of the inverter is proportional to the number of dummy memory cells selected in the dummy path to discharge the dummy bit lines.

Thus, a principle of one or more embodiments of the invention is being able to program the number of dummy memory cells selected by the dummy word line that will actually be used to discharge the dummy bit lines. The embodiments of the invention thus attempt to create a programmable delay for outputting the activation signal by varying only the number of dummy memory cells used to discharge the dummy bit lines.

Figure 5:
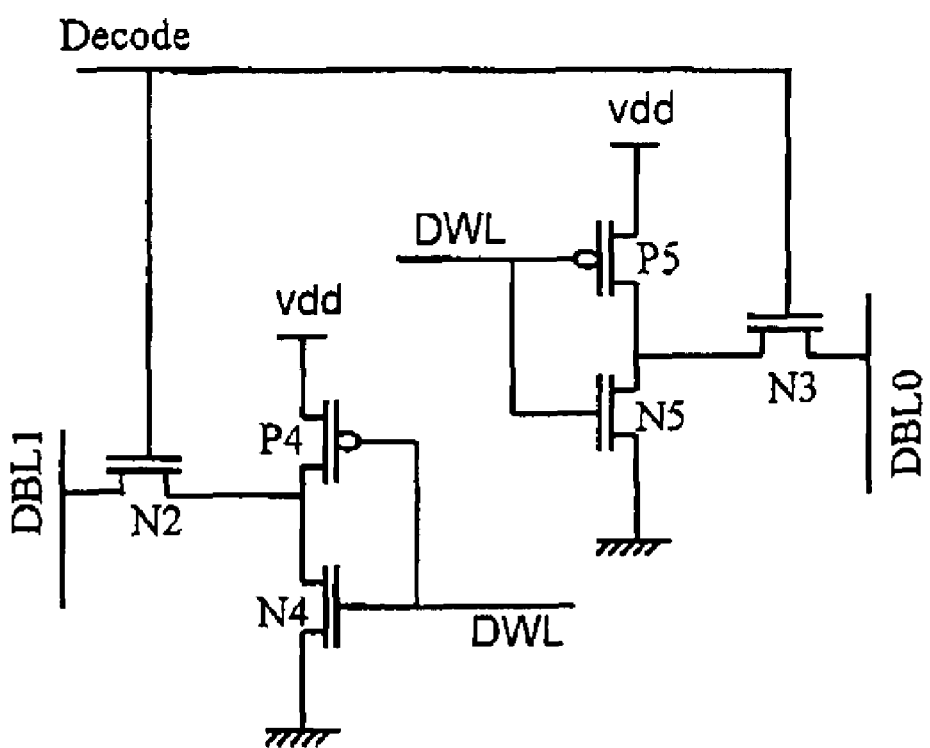
FIG. 5 shows a dummy memory cell selected by the dummy word line to discharge the two dummy bit lines and modified according to one embodiment of the invention.

To achieve this, FIG. 5 shows a dummy memory cell according to one example embodiment of the invention, modified so that its activation can be programmed when it is selected by the dummy word line, to discharge the two dummy bit lines DBL0 and DBL1.

Therefore, the principle of an embodiment of the invention is shown in FIG. 5, based on a dummy memory cell configured to discharge the two dummy bit lines simultaneously, which are then connected together at the input of the inverter of the control means provided to output the read amplifiers activation signal.

Figure 1:
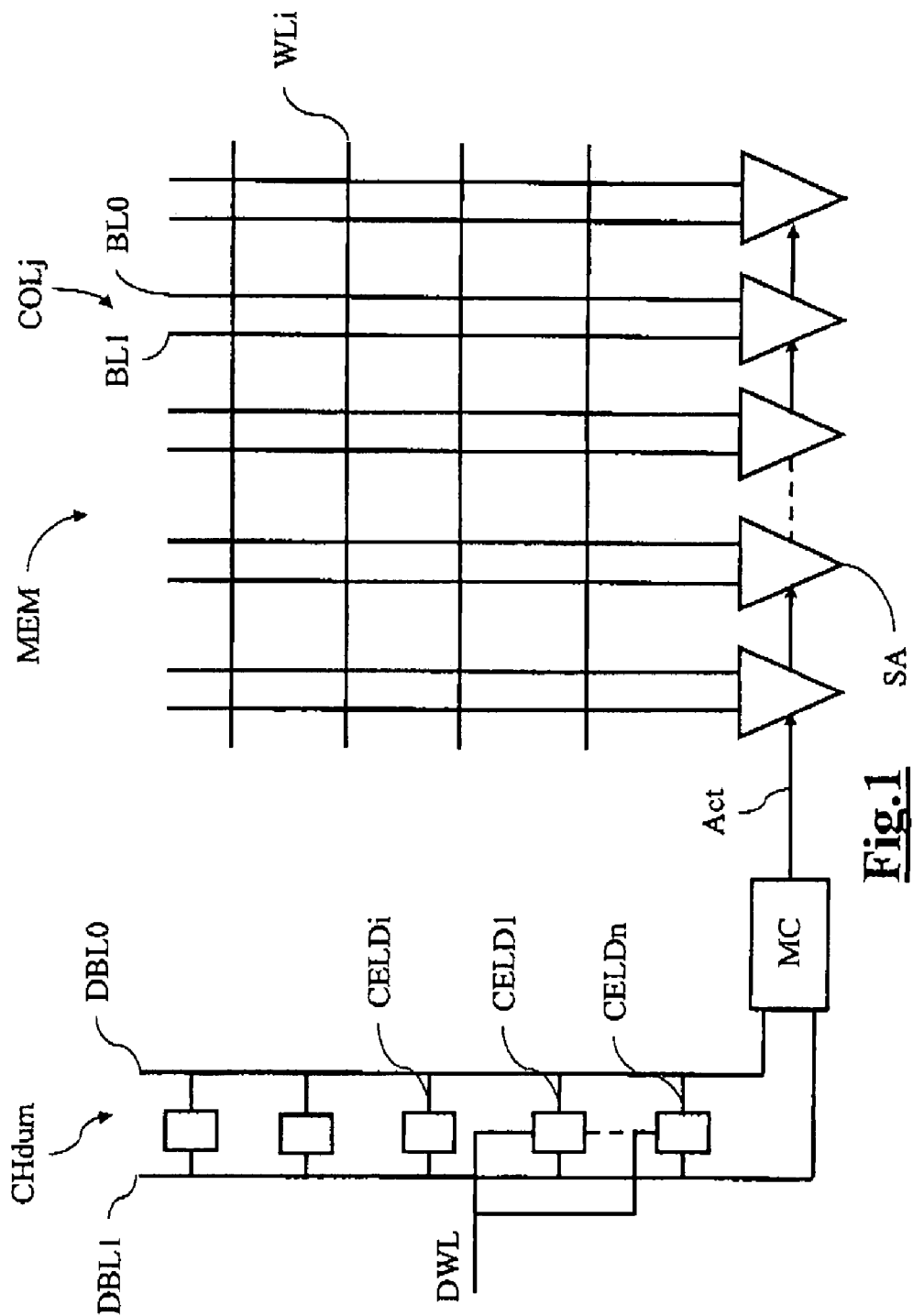
FIG. 1 diagrammatically shows a known SRAM type memory device equipped with a dummy path to output an activation signal to memory read amplifiers.
Figure 2:
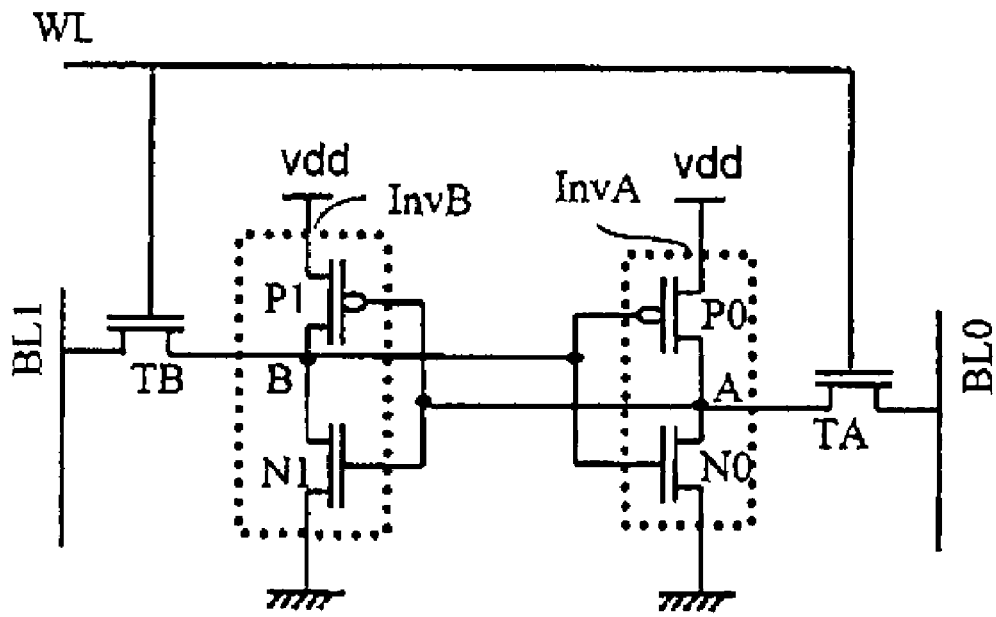
FIG. 2 shows a known architecture of a standard memory cell in the memory plane according to FIG. 1.
Figure 3:
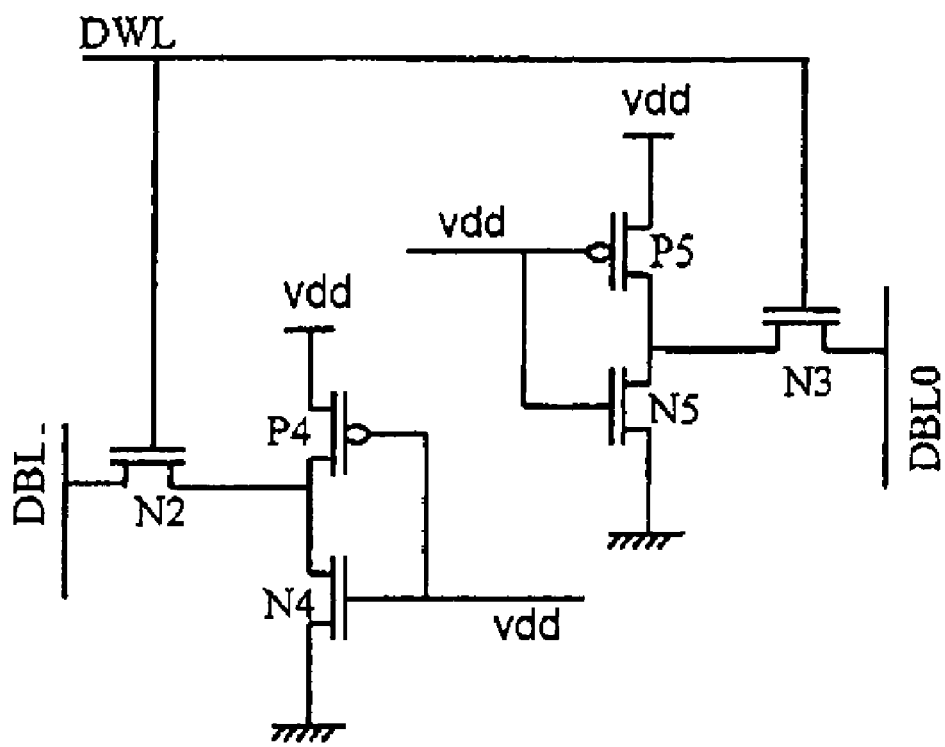
FIG. 3 shows an example configuration according to the state of the art, of a dummy memory cell of the dummy path activated by the dummy word line.
Figure 4:
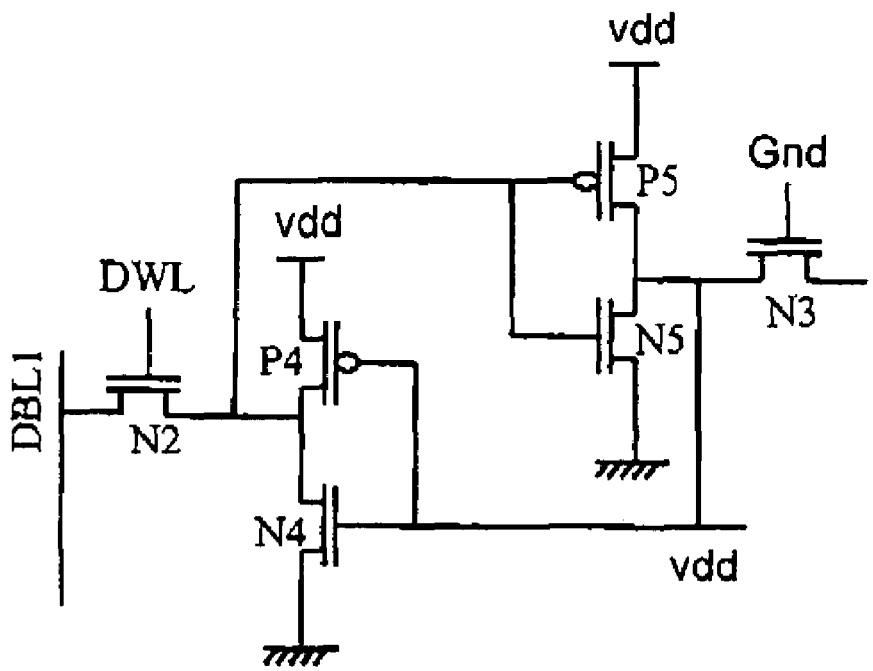
FIG. 4 shows a variant embodiment of the cell in FIG. 3.

Note that in one embodiment, a single side of the dummy memory cell is used to discharge a single dummy bit line instead of both dummy bit lines, to generate the activation signal (based on the embodiment in FIG. 4). Such an embodiment could be envisaged without going outside the framework of an embodiment of the invention.

Thus, with reference to FIG. 5, the dummy memory cell includes four memory transistors forming a first inverter and a second inverter, each composed of an NMOS transistor, N4 and N5 respectively, and a PMOS transistor, P4 and P5 respectively, connected in series between the power supply potential Vdd and the ground potential. The corresponding input to each of the two memory cell inverters is connected to the dummy word line DWL. The cell also includes the two access transistors N2 and N3. The drain of each access transistor N2 and N3 is connected to the output of one of the two inverters, N4/P4 and N5/P5 respectively, and its source is connected to one of the dummy bit lines, DBL1 and DBL0 respectively.

According to embodiments of the invention, the access transistors N2 and N3 of the memory cell are controlled by Decode programming means in the memory cell, so as to program activation of the cell concerned. Therefore each of the two access transistors in the cell receives the binary programming signal Decode on its gate.

Thus configured, if the power supply potential Vdd is applied on the DWL line to select the cell, and if the Decode signal applied to the memory cell is programmed so as to activate the access transistors N2 and N3 in the cell (Decode=logical 1), the transistors N3 and N5, and N2 and N4 respectively, become conducting and a current will discharge the two dummy bit lines DBL0 and DBL1 that were previously precharged, and gradually set their potential to the ground. The two dummy bit lines are connected together such that their discharge current will control the input of the inverter (for example) of the control means provided to output the read amplifiers activation signal.

Thus, by applying the potential Vdd onto the dummy word line DWL, all dummy memory cells CELD1 to CELDn connected to the dummy word line and that will discharge the two dummy bit lines DBL0 and DBL1 are selected, and the Decode programming signal applied to each of these cells is used to program activation of a predetermined number of cells that will actually be used among all these dummy memory cells connected to the dummy word line, to discharge the dummy bit lines. By adjusting the number of dummy memory cells CELD1 to CELDn programmed in selection in this manner, the time to discharge the dummy bit lines can be programmed so that the time at which the activation signal of memory plane read amplifiers is output can be adjusted.

The configuration shown in the example in FIG. 5, with the Decode signal controlling the gates of the access transistors of the cell, is preferred to an alternative configuration that could be envisaged that would consist of applying the DWL signal onto the gate of access transistors N2 and N3, and the Decode signal at the input of the cell inverters. This last configuration can cause a charge sharing problem.

More precisely, if an unprogrammed dummy memory cell (Decode=0) is selected (DWL=1), its internal node will discharge at the same time as the dummy bit line. During the next access, since the internal node of this cell is discharged, as soon as the dummy word line DWL is activated, some of the charges in the dummy bit line will go onto the internal node. Discharge of the dummy bit line will then be due partly to this parasite charge sharing phenomenon between the dummy bit line and this unprogrammed dummy cell, and not only when the dummy memory cells are being read. This problem can be annoying if there is a large number of unprogrammed dummy memory cells.

Figure 6:
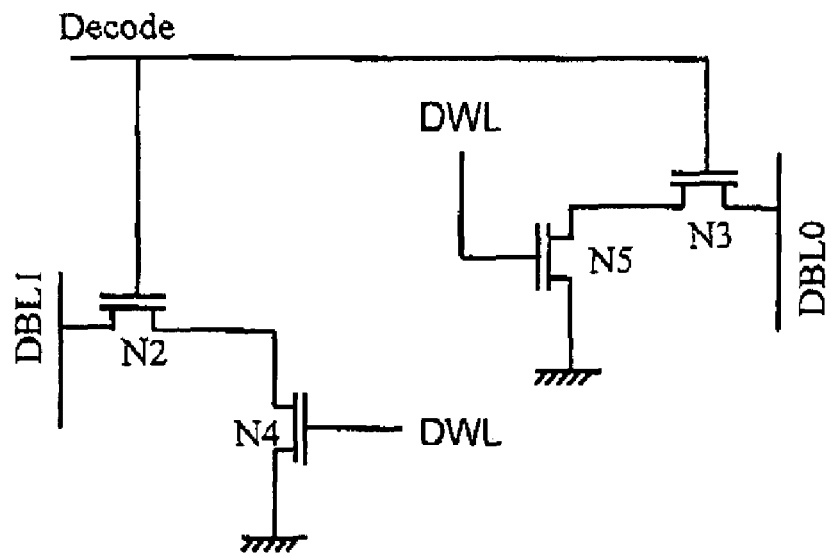
FIG. 6 shows a cell according to FIG. 5, simplified according to a variant embodiment.

FIG. 6 shows a variant embodiment of the memory cell in FIG. 5, in which the PMOS transistors P4 and P5 respectively have been eliminated. The cell structure is thus simplified.

According to this example embodiment, the dummy memory cell programmed in selection includes a first memory transistor N4, of which a source is connected to the ground, a gate is connected to the dummy word line DWL and a drain is connected to the drain of the first access transistor N2 of the cell, the gate of said access transistor is connected to the Decode programming means and its source is connected to the dummy bit line DBL1. The source of a second memory transistor N5 of the cell is connected to the ground, its gate is connected to the dummy word line DWL and its drain is connected to the drain of the second access transistor N3 of the cell, of which the gate is connected to the Decode programming means and the source is connected to the other dummy bit line DBL0.

The disclosed memory devices, including a dummy memory cell configured as shown in FIG. 5 or 6, may be part of an integrated circuit, which may be part of an electronic system, such as a computer system. For example, the integrated circuit may be configured as a memory circuit and may be coupled to a controller to form part of a computer system.

Figure 7:
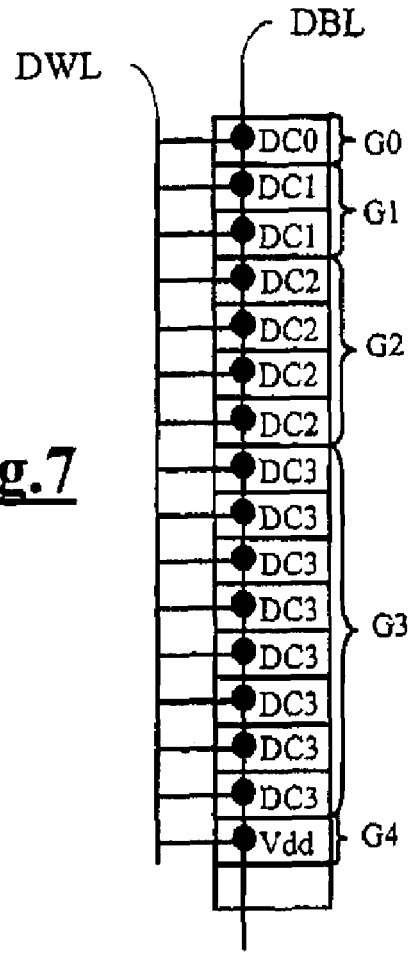
FIG. 7 shows an embodiment of the invention for programming dummy memory cells selected to discharge the dummy bit line(s).

FIG. 7 shows an example embodiment for programming activation as shown in FIG. 5, for a given number of dummy memory cells among all the cells selected to discharge the dummy bit line(s).

According to this example embodiment, sixteen dummy memory cells designed to discharge the dummy bit line(s) DBL, are arranged in five groups, with a predetermined number of cells, G0, G1, G2, G3 and G4 respectively, along the dummy column, all of the dummy memory cells in each group sharing the same dummy word line DWL used to select the cells that will be used to discharge the dummy bit line(s).

Group G0 includes a dummy memory cell, group G1 includes two dummy memory cells, group G2 includes four dummy memory cells, group G3 includes eight dummy memory cells and group G4 includes one dummy memory cell.

Advantageously, each group of dummy memory cells has its own Decode type programming signal, DC0, DC1, DC2, DC3 respectively, the dummy cell in the last group G4 receiving the signal Vdd as the programming signal, such that there is always at least one dummy cell (the group G4 cell) programmed in selection and therefore active to discharge the dummy bit line(s) DBL. Thus, each cell in a given group receives the programming signal associated with this group.

In this way, depending on the value of the binary programming signals DC0 to DC3 applied to each group of cells respectively, it is possible to simultaneously program activation of one to sixteen selected dummy memory cells to discharge the dummy bit line(s) DBL.

For example, if the selection potential vdd is applied on the dummy word line DWL and the programming signal DC0 is active (DC0=logical 1), while all other programming signals associated with groups are inactive (DC1=DC2=DC3=logical 0), there will be two dummy memory cells that will actually be used to discharge the dummy bit line(s) DBL. According to another example, if the programming signal DC1 is active (DC1=logical 1) and all other programming signals are inactive (DC0=DC2=DC3=logical 0), in this case there will be three dummy memory cells actually used to discharge the dummy bit line(s) DBL, etc.

Due to the programming means used to program the number of dummy memory cells that will be used to discharge the dummy bit line(s), it then becomes possible to adjust the time at which the read amplifiers activation signal is output, without any special circuitry being provided for this purpose in the control means. This adjustment of the time at which the read amplifiers activation signal is output depends on a simple programming of binary signals used to activate a given number of dummy memory cells selected by the dummy word line, that will then be used to discharge the dummy bit line(s).

Furthermore, the generated delay varies depending on variations in process parameters in the same way as the discharge of a conventional bit line.

Although the present invention has been disclosed and described by way of some embodiments, it is apparent to those skilled in the art that several modifications to the described embodiments, as well as other embodiments of the present invention are possible without departing from the spirit and scope of the invention.

What is claimed is:

1. A memory device, comprising:
   a dummy memory structure including a plurality of dummy memory cells coupled to a decode signal line, at least one dummy bit line and a dummy word line, the dummy memory structure operable to discharge a current through the at least one dummy bit line in a selected time, the selected time a function of the number of the dummy memory cells that are programmed via a decode signal on the decode signal line, the decode signal being independent of a dummy word line signal on the dummy word line;
   a memory controller coupled to the dummy memory structure and operable to output a read activation signal responsive to the current; and
   a memory cell array including a plurality of memory cells, the memory cell array coupled to the memory controller to receive the read activation signal.

2. The memory device of claim 1:
   wherein the plurality of dummy memory cells are arranged in groups, each of the groups including a predetermined number of the dummy memory cells;
   further comprising a programming signal source coupled to the dummy memory structure and operable to output a programming signal selected to activate one of the groups.

3. The memory device of claim 1 wherein the at least one dummy bit line comprises two dummy bit lines.

4. The memory device of claim 1 wherein the at least one dummy bit line comprises a single dummy bit line.

5. The memory device of claim 1:
   wherein the at least one dummy bit line comprises first and second dummy bit lines; and
   wherein each of the dummy memory cells comprises:
   a first inverter including an input coupled to the dummy word line and an output;
   a first access transistor including a drain coupled to the output of the first inverter, a gate coupled to a programming signal source, and a source coupled to the first dummy bit line;
   a second inverter including an input coupled to the dummy word line and an output; and
   a second access transistor including a drain coupled to the output of the second inverter, a gate coupled to the programming signal source, and a source coupled to the second dummy bit line.

6. The memory device of claim 5 wherein the first inverter and the second inverter each comprises:
   an NMOS transistor and a PMOS transistor connected in series between a power supply potential and a ground potential.

7. The memory device of claim 1:
   wherein the at least one dummy bit line comprises first and second dummy bit lines; and
   wherein each of the dummy memory cells comprises:
   a first inverter including an input coupled to a programming signal source and an output;
   a first access transistor including a drain coupled to the output of the first inverter, a gate coupled to the dummy word line, and a source coupled to the first dummy bit line;
   a second inverter including an input coupled to the programming signal source and output; and a second access transistor including a drain coupled to the output of the second inverter, a gate coupled to the dummy word line, and a source coupled to the second dummy bit line.

8. The memory device of claim 1:

wherein the at least one dummy bit line comprises first and second dummy bit lines; and wherein each of the dummy memory cells comprises:
- a first memory transistor including a source coupled to a ground potential, a gate coupled to the dummy word line, and a drain;
- a first access transistor including a drain coupled to the drain of the first memory transistor, a gate coupled to a programming signal source, and a source coupled to the first dummy bit line;
- a second memory transistor including a source coupled to a ground potential, a gate coupled to the dummy word line, and a drain; and
- a second access transistor including a drain coupled to the drain of the second memory transistor, a gate coupled to the programming signal source, and a source coupled to the second dummy bit line.

9. The memory device of claim 1 wherein the controller comprises an inverter including an input coupled to the at least one dummy bit line to receive the current.

10. The memory device of claim 1, further comprising:
a plurality of read amplifiers coupled to the controller and operable to read the plurality of memory cells of the memory array responsive to the read activation signal.

11. A system, comprising:
a controller; and
a memory device coupled to the controller, the memory device including:
- a dummy memory structure including a plurality of dummy memory cells each coupled to a respective decode signal line via a respective access transistor, at least one dummy bit line and a dummy word line, the dummy memory structure operable to discharge a current through the at least one dummy bit line in a selected time, the selected time a function of the number of the dummy memory cells that are programmed;
- a memory controller coupled to the dummy memory structure and operable to output a read activation signal responsive to the current; and
- a memory cell array including a plurality of memory cells, the memory cell array coupled to the memory controller to receive the read activation signal.

12. A method, comprising:
generating a decode signal;
programming a selected first number of dummy memory cells from among a plurality of dummy memory cells with the decode signal to set a first discharge time for discharging at least one dummy bit line; and
discharging at least one dummy bit line coupled to the plurality of dummy memory cells in the first discharge time.

13. The method of claim 11, further comprising:
re-programming a selected second number of dummy memory cells to set a second discharge time for discharging the at least one dummy bit line, the second discharge time not equal to the first discharge time; and
discharging the at least one dummy bit line in the second discharge time.

14. The method of claim 11 wherein programming a selected first number of dummy memory cells comprises selectively programming the selected first number of dummy memory cells as a group responsive to a programming signal.

15. The method of claim 11, further comprising:
activating read amplifiers responsive to receiving a discharge current from the at least one dummy bit line.

* * * * *